(12) United States Patent
Miyajima et al.

(10) Patent No.: US 6,717,824 B2
(45) Date of Patent: Apr. 6, 2004

(54) PRINTED WIRING BOARD UNIT, AUXILIARY SUBSTRATE FOR HIERARCHICAL MOUNTING, AND ELECTRONIC APPARATUS

(75) Inventors: Takashi Miyajima, Kawasaki (JP); Sachiko Sano, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/996,736

(22) Filed: Nov. 30, 2001

(65) Prior Publication Data

US 2002/0054486 A1 May 9, 2002

Related U.S. Application Data

(63) Continuation of application No. PCT/JP99/03731, filed on Jul. 9, 1999.

(51) Int. Cl.[7] .............................. H05K 1/11; H05K 1/14
(52) U.S. Cl. ...................................... 361/803; 361/790
(58) Field of Search ................................ 361/760–764, 361/790, 803, 785, 742; 257/685–686, 777, 691, 655; 174/260; 439/68

(56) References Cited

U.S. PATENT DOCUMENTS

| | | | |
|---|---|---|---|
| 5,309,324 A | | 5/1994 | Herandez et al. |
| 5,331,591 A | * | 7/1994 | Clifton ........................ 365/182 |
| 5,454,160 A | * | 10/1995 | Nickel .......................... 29/840 |
| 5,475,261 A | | 12/1995 | Tanizawa |
| 5,701,233 A | * | 12/1997 | Carson et al. ............... 257/685 |
| 6,160,705 A | * | 12/2000 | Stearns et al. ............... 174/252 |
| 6,313,998 B1 | * | 11/2001 | Kledzik et al. ............. 257/686 |
| 6,472,735 B2 | * | 10/2002 | Isaak ........................... 257/686 |

FOREIGN PATENT DOCUMENTS

| | | |
|---|---|---|
| DE | 3134385 | 3/1983 |
| JP | 62-261166 | 11/1987 |
| JP | 64-44640 | 3/1989 |
| JP | 1-125571 | 8/1989 |
| JP | 2-146792 | 6/1990 |
| JP | 2-186694 | 7/1990 |
| JP | 3-101188 | 4/1991 |
| JP | 4-278596 | 10/1992 |
| JP | 6-29421 | 2/1994 |
| JP | 6-85154 | 3/1994 |
| JP | 6-152096 | 5/1994 |
| JP | 7-15107 | 1/1995 |
| JP | 10-256423 | 9/1998 |
| JP | 10-290054 | 10/1998 |
| JP | 11-7348 | 1/1999 |

* cited by examiner

*Primary Examiner*—Evan Pert
*Assistant Examiner*—Tuan Dinh
(74) *Attorney, Agent, or Firm*—Westerman, Hattori, Daniels & Adrian, LLP

(57) ABSTRACT

A rectangular frame-like auxiliary substrate for hierarchical mounting 14 is mounted so as to surround a semiconductor component 15 mounted on a printed wiring board 11, and another semiconductor component 16 is mounted above the semiconductor component 15, being supported on the auxiliary substrate for hierarchical mounting 14 with terminals of the semiconductor component 16 being connected thereto. The auxiliary substrate for hierarchical mounting 14 has wiring patterns 35a and through holes 34a, and includes a power supply layer 32 and a ground layer 33 inside thereof with printed wiring board pads on a lower surface of the auxiliary substrate for hierarchical mounting 14 being more dispersed than component pads 23a on an upper surface of the auxiliary substrate for hierarchical mounting 14. Therefore, a gap space 41 between each adjacent ones of pads 40a on the printed wiring board 11 which gap space 41 corresponds to the semiconductor component 16 is widened so that a wiring pattern 43 extending outward on the printed wiring board from a pad 21a connected to the semiconductor component 15 passes through the gap space 41 without difficulty.

11 Claims, 20 Drawing Sheets

$N_1$ : NUMBER OF PADS 36a
$N_2$ : NUMBER OF PADS 23a $N_1 < N_2$

PRINTED WIRING BOARD UNIT, AUXILIARY SUBSTRATE FOR HIERARCHICAL MOUNTING, AND ELECTRONIC APPARATUS

This is a continuation of PCT/JP99/03732 filed Jul. 8, 1999.

TECHNICAL FIELD

The present invention generally relates to printed wiring board units, auxiliary substrates for hierarchical mounting, and electronic apparatuses, and more particularly to a printed wiring board unit mounted in a personal digital assistant or a notebook personal computer, an auxiliary substrate for hierarchical mounting used in such a printed wiring board unit, and an electronic apparatus including such a printed wiring board unit.

A miniaturization, multi-functionalization, and advanced features are demanded of the personal digital assistant and notebook personal computer. In order to meet such demands, the printed wiring board unit mounted in the notebook personal computer requires a structure where semiconductor components are mounted with high density in a limited space.

BACKGROUND ART

A conventional printed wiring board unit on which semiconductor components are mounted with high density in a limited space has any of the following structures:

① A structure where the semiconductor components are mounted on both sides of a mother-board printed wiring board.

② A structure where a multi chip module of the semiconductor components is mounted on a mother-board printed wiring board.

③ A structure where a chip size package of the semiconductor components is mounted on a mother-board printed wiring board.

Further, each of Japanese Lai-Open Patent Application Nos. 6-152096, 3-101188, and 4-278596 discloses a structure where semiconductor components are hierarchically mounted on a printed wiring board for high-density mounting.

The structure where the semiconductor components are mounted on both sides of a mother-board printed wiring board requires the mother-board printed wiring board to have parts for mounting the semiconductor components on both upper and lower surfaces of the mother-board printed wiring board. Further, this structure requires the mother-board printed wiring board to increase in size if the number of components increases.

The structure where a multi-chip-module printed wiring board is mounted requires advanced technology to produce the multi-chip-module printed wiring board, thus increasing the production costs of the printed wiring board unit.

In the case of employing the chip size package, wiring on the mother-board printed wiring board becomes too dense so that the production costs of the printed wiring board are raised.

In the case of the structure where the semiconductor components are hierarchically mounted on a printed wiring board, a group of lower semiconductor component pads to be connected to the terminals of a lower semiconductor component are arranged inside a group of upper semiconductor component pads to be connected to the terminals of an upper semiconductor component on the printed wiring board so that the groups of the lower and upper semiconductor component pads are substantially concentric with each other, and wiring patterns extending from the lower semiconductor component pads extend outward through spaces each formed between each adjacent ones of the upper semiconductor component pads.

The number of the terminals of semiconductor components is increasing with advanced features of a notebook personal computer. Therefore, a pitch between each adjacent ones of the upper semiconductor component pads becomes shorter so as to produce a narrower space therebetween. This makes it difficult to pass the wiring patterns extending from the lower semiconductor component pads through the spaces between the upper semiconductor component pads. None of the above-described Japanese Laid-Open Patent Application Nos. 6-152096, 3-101188, and 4-278596 discloses any device for passing wiring patterns through spaces between adjacent pads. Therefore, it is difficult to apply any of structures disclosed in the above-described Japanese Laid-Open Patent Application Nos. 6-152096, 3-101188, and 4-278596 to semiconductor components with a large number of terminals.

DISCLOSURE OF THE INVENTION

It is a general object of the present invention to provide a printed wiring board unit, an auxiliary substrate for hierarchical mounting, and an electronic apparatus in which the above-described prior-art disadvantages are eliminated.

A more specific object of the present invention is to provide a printed wiring board that realizes hierarchical mounting of components on a printed wiring board without wiring patterns being formed too densely on the printed wiring board.

This object of the present invention is achieved by a printed wiring board unit, wherein a first component is mounted on a printed wiring board, an auxiliary substrate for hierarchical mounting is mounted next to the mounted first component on the printed wiring board, a second component larger in size than the first component is mounted above the first component, the second component being supported on the auxiliary substrate for hierarchical mounting with terminals of the second component being connected thereto, and the auxiliary substrate for hierarchical mounting has component pads on an upper surface thereof, the pads being connected to the terminals of the second component, printed wiring board pads on a lower surface thereof, the printed wiring board pads being connected to pads on the printed wiring board, and includes ground and power supply layers inside thereof, wherein the component pads and the printed wiring board pads are electrically connected, the printed wiring board pads are decreased in number with component ground terminals included in the component pads and connected to a plurality of ground terminals of the second component being gathered by being connected to the ground layer and component power supply terminals included in the component pads and connected to a plurality of power supply terminals of equal potentials of the second component being gathered by being connected to the power supply layer, and the printed wiring board pads are more dispersed than the component pads.

According to the above-described printed wiring board unit, a gap space between adjacent pads on the printed wiring board which gap space corresponds to the second component is widened so that a wiring pattern extending outward on the printed wiring board from a pad connected to the first component passes through the gap space without difficulty.

Another more specific object of the present invention is to provide an auxiliary substrate for hierarchical mounting used for hierarchical mounting of components on a printed wiring board without wiring patterns being formed too densely on the printed wiring board.

This object of the present invention is achieved by an auxiliary substrate for hierarchical mounting having component pads on an upper surface thereof, the component pads being connected to terminals of a second component larger in size than a first component mounted on a printed board, and printed wiring board pads on a lower surface thereof, the printed wiring board pads being connected to pads on the printed wiring board, and including ground and power supply layers inside thereof, wherein the component pads and the printed wiring board pads are electrically connected, the printed wiring board pads are decreased in number with component ground terminals included in the component pads and connected to a plurality of ground terminals of the second component being gathered by being connected to the ground layer and component power supply terminals included in the component pads and connected to a plurality of power supply terminals of equal potentials of the second component being gathered by being connected to the power supply layer, and the printed wiring board pads are more dispersed than the component pads.

Other objects, features and advantages of the present invention will become more apparent from the following detailed description when read in conjunction with the accompanying drawings.

BEST MODE FOR CARRYING OUT THE INVENTION

[First Embodiment]

Figure 3:
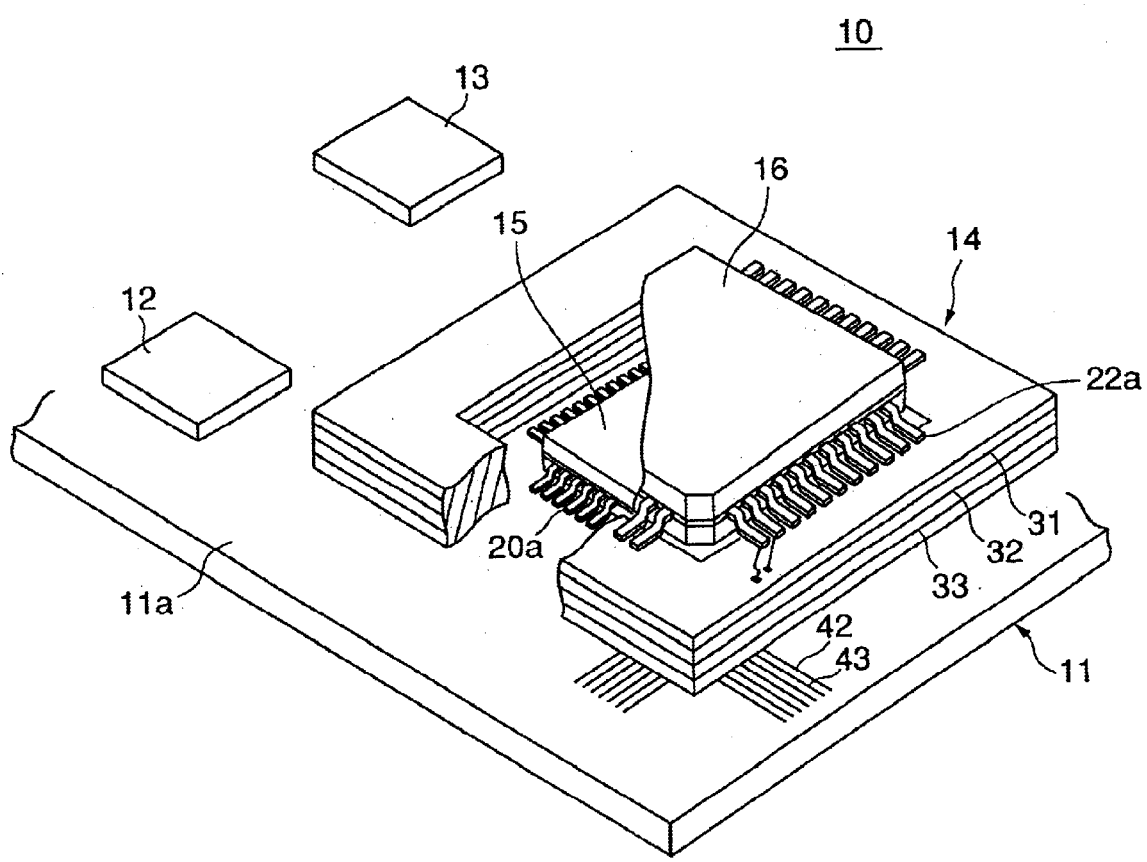
FIG. 3 is a perspective view of the printed wiring board unit according to the first embodiment of the present invention with a part of the printed wiring board unit being cut off.
Figure 4:
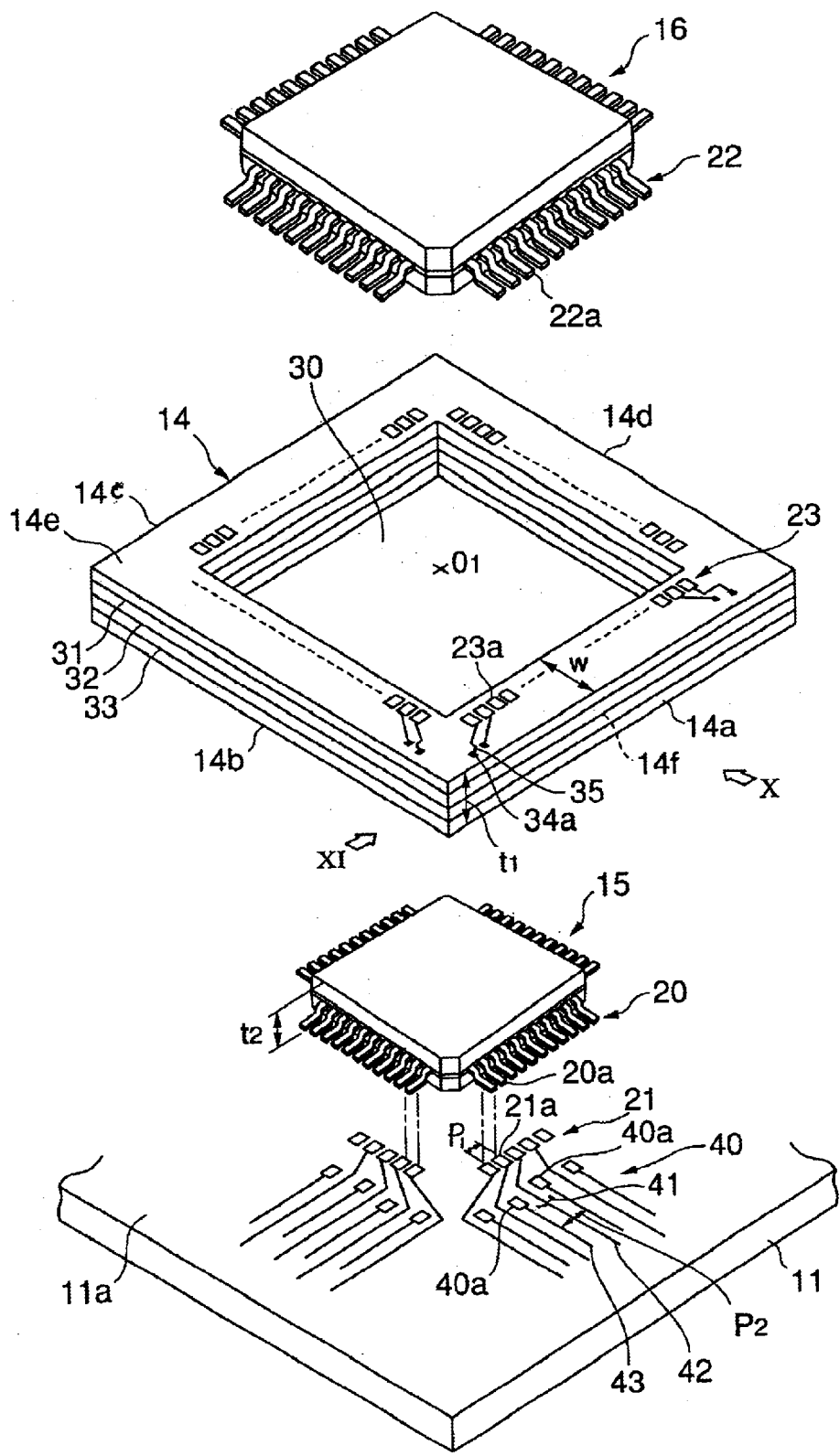
FIG. 4 is an exploded perspective view of the printed wiring board unit according to the first embodiment of the present invention.
Figure 5:
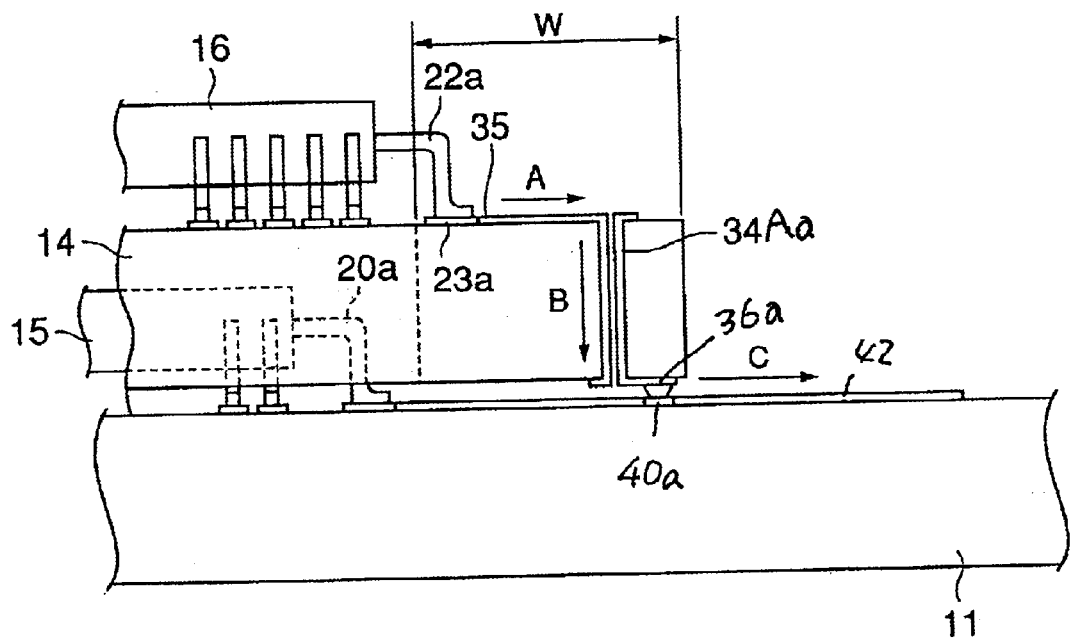
FIG. 5 is an enlarged view of a part of FIG. 2 which part is circled by circle V.
Figure 6:
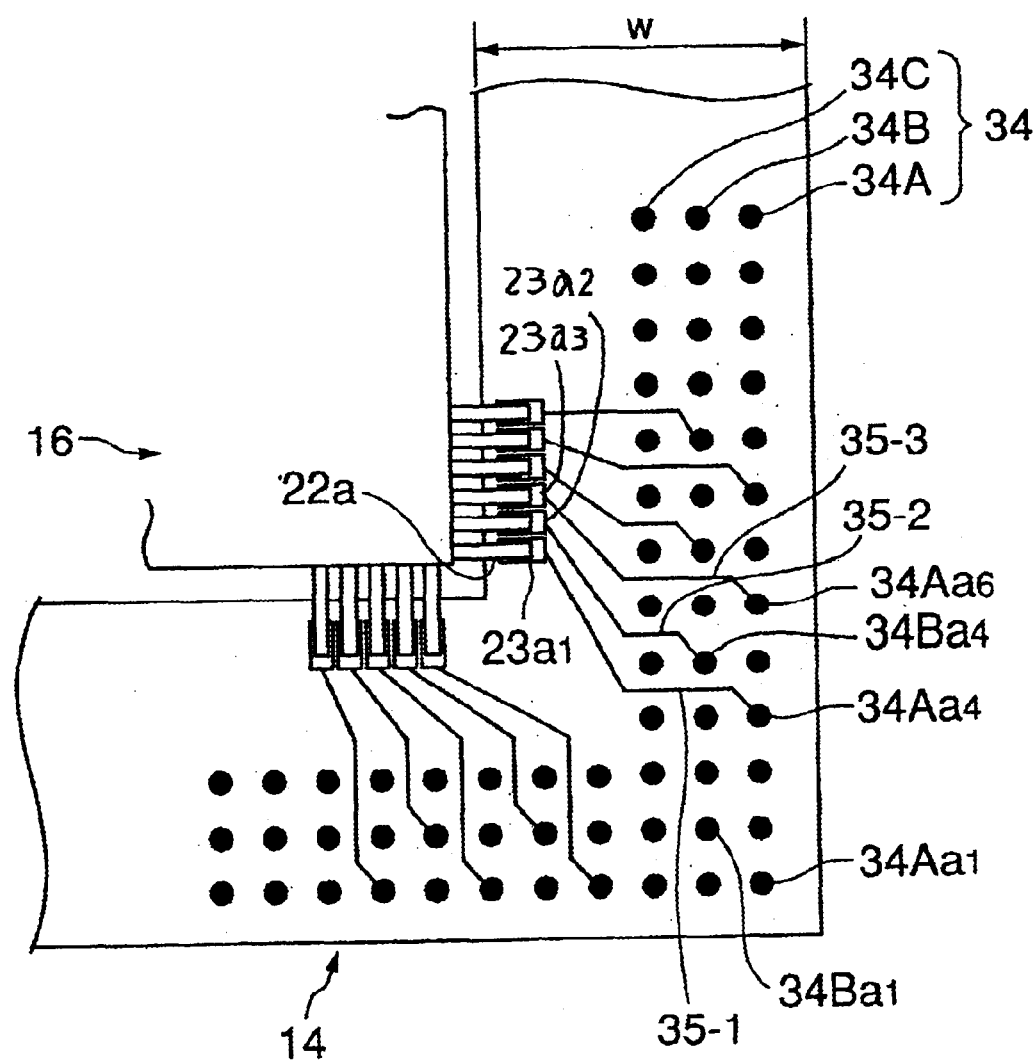
FIG. 6 is an enlarged view of a part of FIG. 1 which part is circled by circle VI.
Figure 7:
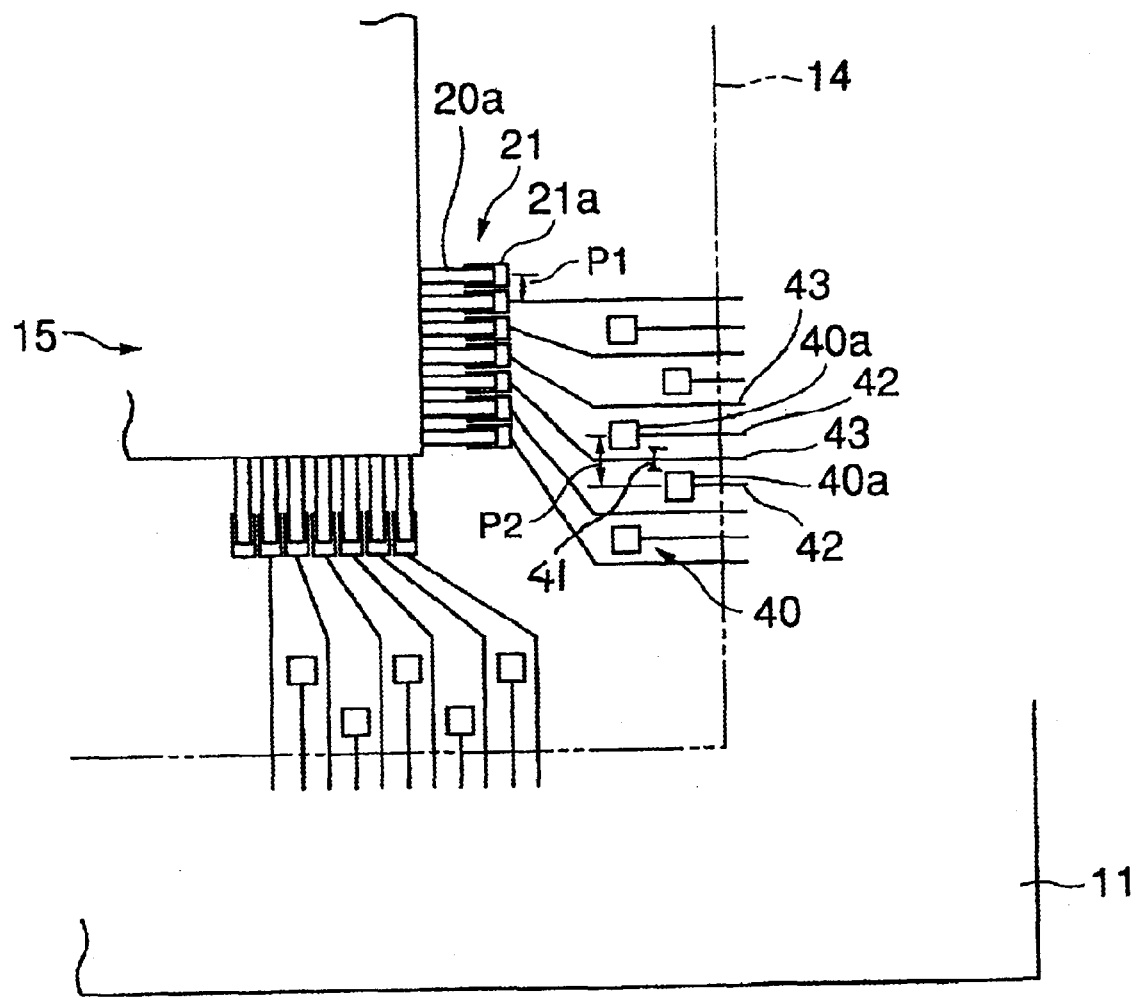
FIG. 7 is a diagram showing a state where an auxiliary substrate for hierarchical mounting is removed.
Figure 8:
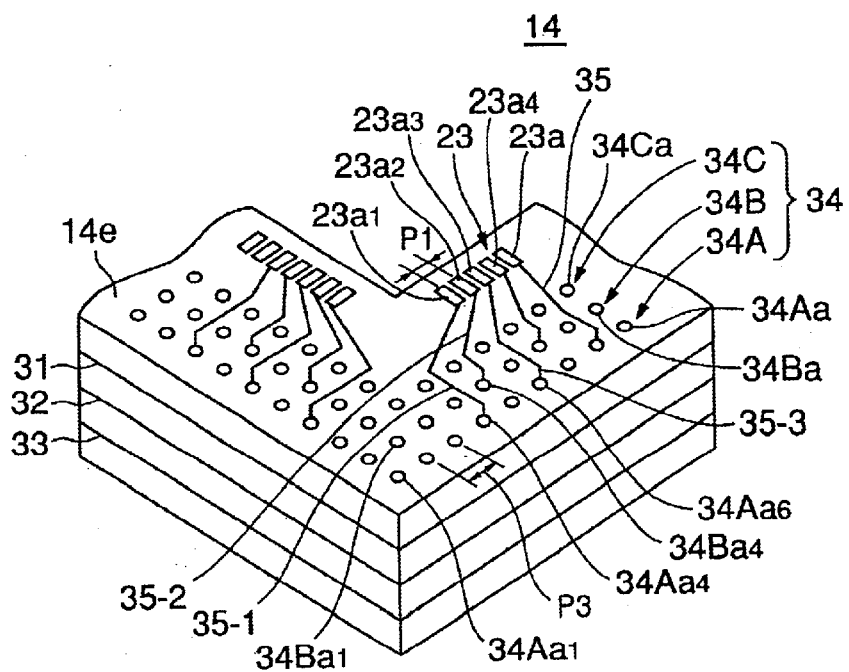
FIG. 8 is an upper-side enlarged fragmentary perspective view of the auxiliary substrate for hierarchical mounting.
Figure 9:
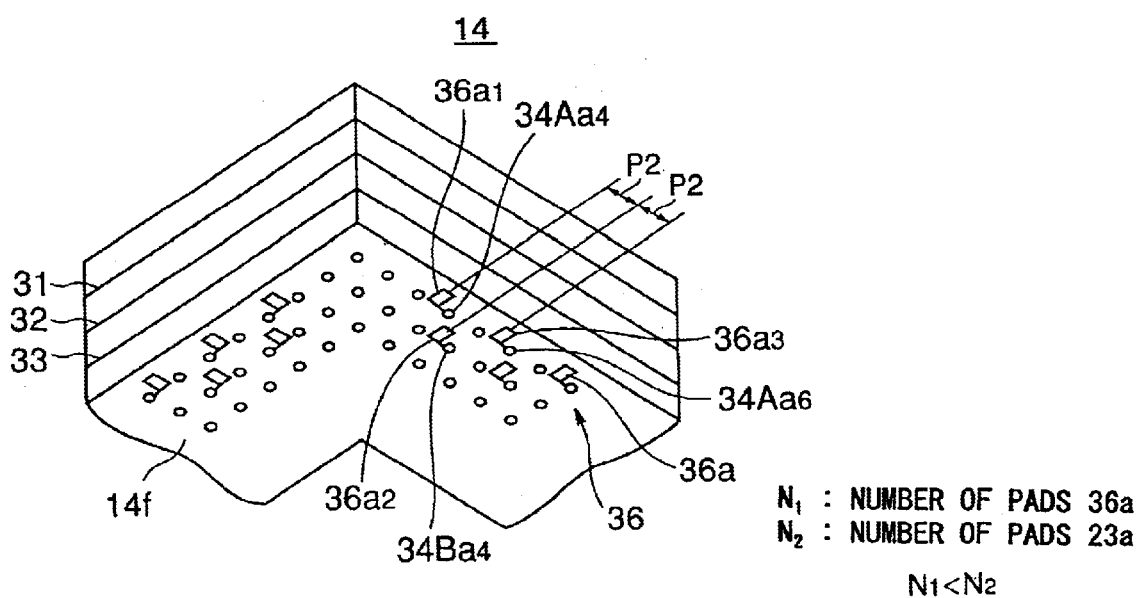
FIG. 9 is a lower-side enlarged fragmentary perspective view of the auxiliary substrate for hierarchical mounting.
Figure 12:
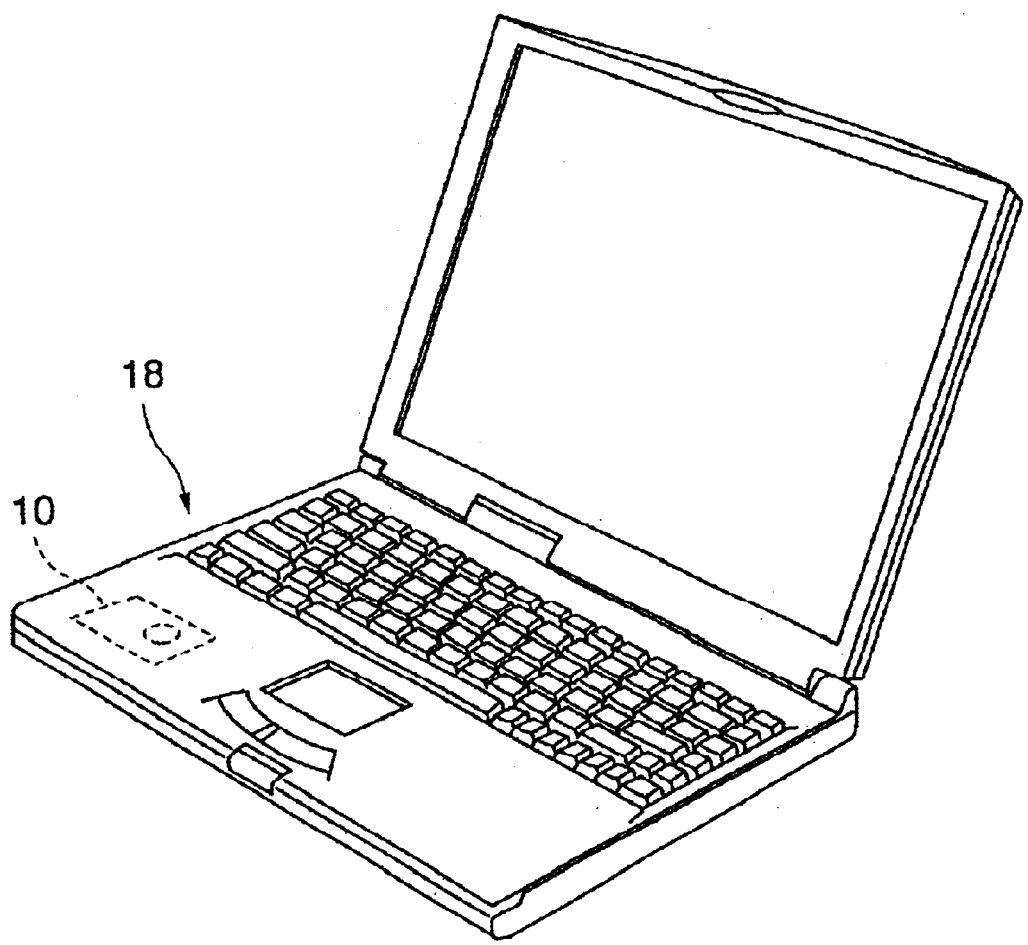
FIG. 12 is a diagram showing a notebook personal computer including the printed wiring board unit of FIG. 1.

FIGS. 1 through 4 are diagrams showing a printed wiring board unit 10 according to a first embodiment of the present invention. FIGS. 5 through 7 are enlarged partial views of the printed wiring board unit 10. This printed wiring board unit 10 is designed to be mounted in a small-size electronic apparatus such as a personal digital assistant or a notebook personal computer. The printed wiring board unit 10 includes a mother-board printed wiring board 11 as a mother board and semiconductor components 15 and 16 of a QFP (Quad Flat Package) type hierarchically provided and mounted on an upper surface 11a of the printed wiring board 11 by using an auxiliary substrate for hierarchical mounting 14. Other semiconductor components 12 and 13 are also mounted on the upper surface 11a of the printed wiring board 11. As shown in FIG. 12, the printed wiring board unit 10 is mounted inside a notebook personal computer 18.

The semiconductor component 15 is mounted on the upper surface 11a of the printed wiring board 11 with lead terminals 20a of a lead terminal group 20 extending from the four sides of a package that is a main body of the semiconductor component 15 being soldered to corresponding pads 21a of a pad group 21 on the upper surface 11a of the printed wiring board 11. The auxiliary substrate for hierarchical mounting 14 has a frame-like shape defined by four sides 14a through 14d. The auxiliary substrate for hierarchical mounting 14 has a lower surface 14f thereof mounted on the upper surface 11a of the printed wiring board 11 so as to surround the semiconductor component 15. The semiconductor component 16 is larger than the semiconductor component 15 and corresponds to the auxiliary substrate for hierarchical mounting 14 in size. The semiconductor component 16 is mounted on an upper surface 14e of the auxiliary substrate for hierarchical mounting 14 with lead terminals 22a of a lead terminal group 22 extending from the four sides of a package that is a main body of the semiconductor component 16 being soldered to corresponding pads 23a of a pad group 23 on the upper surface 14e of the auxiliary substrate for hierarchical mounting 14. The semiconductor component 16 is provided above the semiconductor component 15 to cover the semiconductor component 15. The semiconductors 15 and 16 are arranged to form a hierarchical structure.

Next, a description will be given, with reference to FIGS. 8 through 11, of the auxiliary substrate for hierarchical mounting 14.

The auxiliary substrate for hierarchical mounting 14 has a structure corresponding to that of the semiconductor component 16. A lower surface 14f of the auxiliary substrate for hierarchical mounting 14 has a structure corresponding to that of a part of the upper surface 11a of the printed wiring board 11 on which part the auxiliary substrate for hierarchical mounting 14 is mounted.

As shown in FIGS. 1 through 4, the auxiliary substrate for hierarchical mounting 14 is a little larger in size than the semiconductor component 15 and has a thickness size t1 that is a little larger than a thickness size t2 of the semiconductor component 15 so that the semiconductor component 15 may be accommodated in a space 30 formed inside the auxiliary substrate for hierarchical mounting 14 without projecting higher than the upper surface 14e. Further, each of the sides 14a through 14d of the auxiliary substrate for hierarchical mounting 14 has a width of a size w. The size w is approximately 10 mm. As will be later described, printed wiring board mounting pads 36a of a pad group 36 are dispersed by taking advantage of this width of the size w.

As shown in FIGS. 5,6,8, and 9, the auxiliary substrate for hierarchical mounting 14 is made of a glass epoxy resin and includes inside thereof, from top to bottom, a signal layer 31, a power supply layer 32, and a ground layer 33. The auxiliary substrate for hierarchical mounting 14 further includes a through hole group 34, and has the pad group 23 of the numerous semiconductor component mounting pads 23a used for mounting of the semiconductor component 16 and wiring patterns 35 formed on the upper surface 14e and the pad group 36 of the numerous printed wiring board mounting pads 36a used for mounting on the printed wiring board 11 formed on the lower surface 14f. A pitch p2 between each adjacent ones of the pads 36a is approximately twice a pitch p1 between each adjacent ones of the pads 23a so that the pads 36a are more dispersed than the pads 23a. A reason for this will be later described. A number N1 of pads 36a is smaller than a number N2 of the pads 23a. A reason for this will also be described later.

The pad group 23 is formed on a part of the upper surface 14e which part is closer to the inner circumference of the auxiliary substrate for hierarchical mounting 14. The through hole group 34 is formed in three rows in a part of the upper surface 14e which part is closer to the periphery of the auxiliary substrate for hierarchical mounting 14. An outermost row is a through hole group 34A formed of numerous through holes 34Aa. A middle row is a through hole group 34B formed of numerous through holes 34Ba. An innermost row is a through hole group 34C formed of numerous through holes 34Ca. The through holes 34Aa, 34Ba, and 34Ca of their respective through hole groups 34A, 34B, and 34C are arranged with pitches p3 each approximately twice the pitch p1 for the pads 23a.

A pad 23a1 and a through hole 34Aa4 are connected by a wiring pattern 35-1. A pad 23a2 and a through hole 34Ba4 are connected by a wiring pattern 35-2. A pad 23a3 and a through hole 34a6 are connected by a wiring pattern 35-3. Thus, the pads 23a are connected alternately with every other through holes 34Aa of the through hole group 34A of the outermost row and every other through holes 34Ba of the through hole group 34B of the middle row by the wiring patterns 35.

On the lower surface 14f, a pad 36a1 is positioned next to the through hole 34Aa4 so as to be electrically connected thereto. A pad 36a2 is positioned next to the through hole 34Ba4 so as to be electrically connected thereto. A pad 36a3 is positioned next to the through hole 34Aa6 so as to be electrically connected thereto. The pads 36a1, 36a2, and 36a3 are arranged zigzag.

The pad 23a1 and the pad 36a1 are electrically connected through the wiring pattern 35-1 and the through hole 34Aa4. The pad 23a2 and the pad 36a2 are electrically connected through the wiring pattern 35-2 and the through hole 34Ba4. The pad 23a3 and the pad 36a3 are electrically connected through the wiring pattern 35-3 and the through hole 34Aa6. The other pads 23a and the other pads 36a are also electrically connected through the wiring patterns and through holes.

Figure 10:
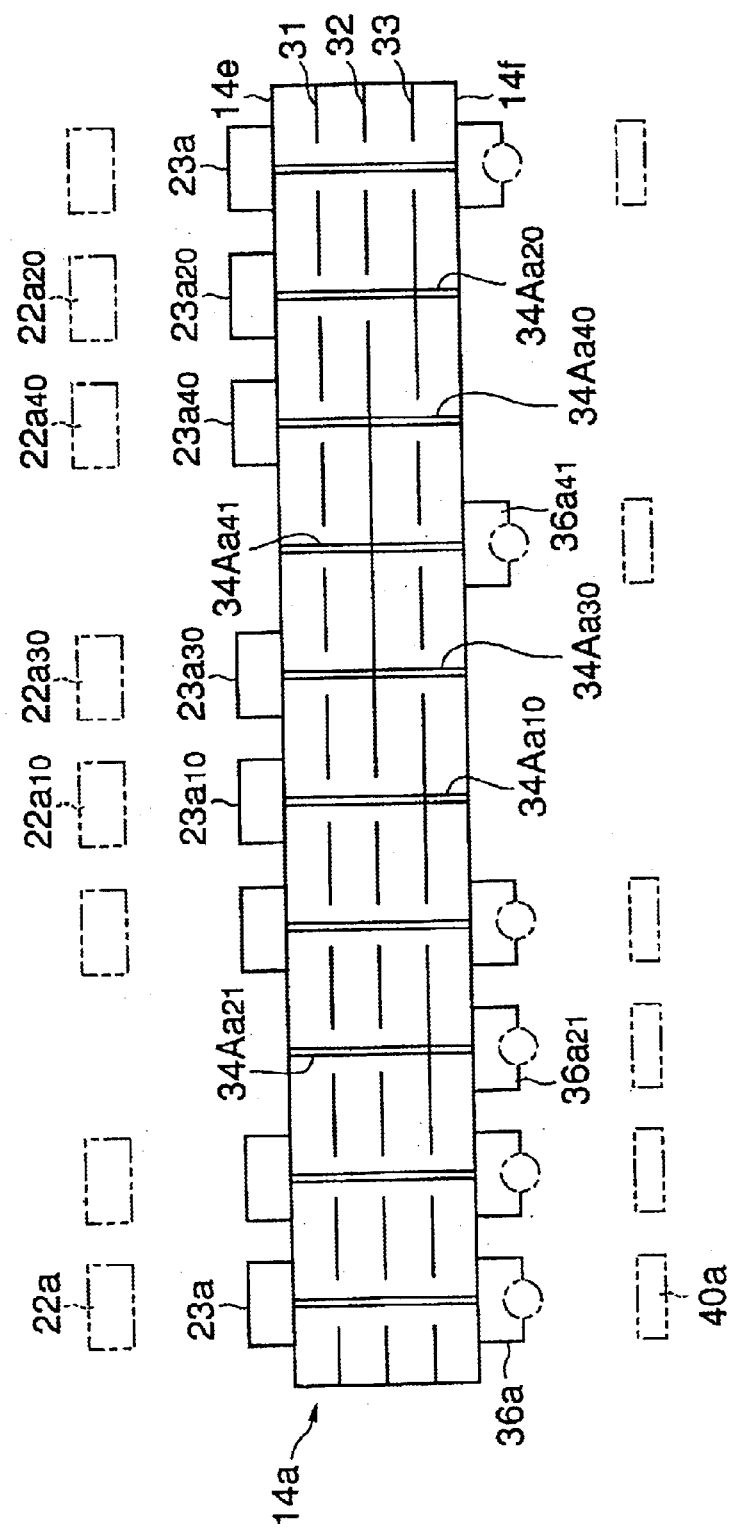
FIG. 10 is a schematic diagram showing an internal structure of one side of the auxiliary substrate for hierarchical mounting, the internal structure being viewed from a direction of arrow X in FIG. 4.
Figure 11:
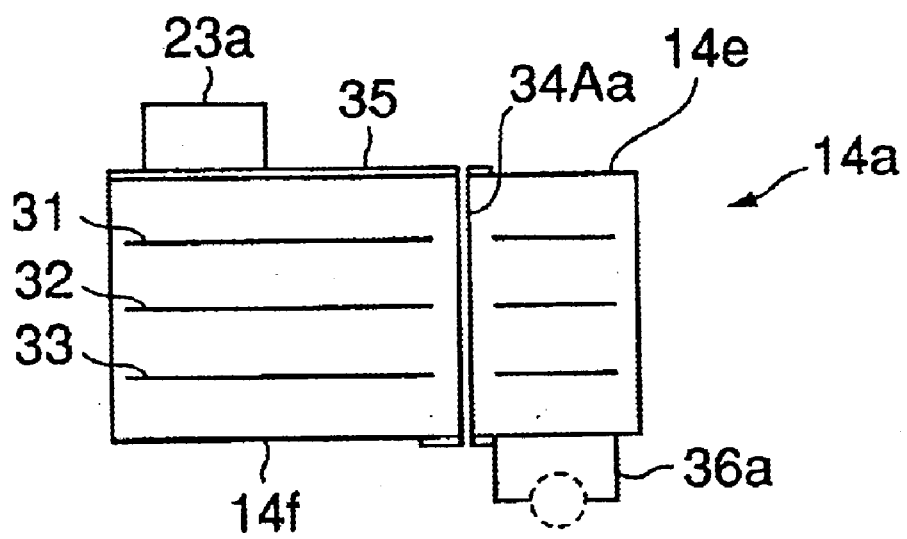
FIG. 11 is a schematic diagram showing an internal structure of one side of the auxiliary substrate for hierarchical mounting, the internal structure being viewed from a direction of arrow XI in FIG. 4.

Further, the semiconductor component 16 includes a plurality of ground lead terminals and a plurality of power supply lead terminals. In FIG. 10, the ground lead terminals are referred to by 22a10 and 22a20, and the power supply lead terminals are referred to by 22a30 and 22a40.

In FIG. 10, ground pads to which the ground lead terminals 22a10 and 22a20 are to be connected are referred to by 23a10 and 23a20. Power supply pads to which the power supply lead terminals 22a30 and 22a40 are to be connected are referred to by 22a30 and 22a40.

A through hole 34Aa10 connected to the ground pad 23a10 by a wiring pattern on the upper surface 14e and a through hole 34Aa20 connected to the pad 23a20 by a wiring pattern on the upper surface 14e are both connected to the ground layer 33. Another through hole 34Aa21 is connected to the ground layer 33. On the lower surface 14f, no pad is formed for any of the through holes 34Aa10 and 34Aa20, but a ground pad 36a21 is formed for the through hole 34Aa21. Therefore, pads on the lower surface 14f for the pads 23a10 and 23a20 are integrated into the single ground pad 36a21. This reduces the number of the pads 36a on the lower surface 14f by one compared with that of the pads 23a on the upper surface 14e.

Further, a through hole 34Aa30 connected to the pad 23a30 by a wiring pattern on the upper surface 14e and a through hole 34Aa40 connected to the pad 23a40 by a wiring pattern on the upper surface 14e are both connected to the power supply layer 32. Another through hole 34Aa41 is connected to the power supply layer 32. On the lower surface 14f, no pad is formed for any of the through holes 34Aa30 and 34Aa40, but a power supply pad 36a41 is formed for the through hole 34Aa41. Therefore, pads on the lower surface 14f for the through holes 34Aa30 and 34Aa40 are integrated into the single power supply pad 36a41. This further reduces the number of the pads 36a on the lower surface 14f by another one compared with that of the pads 23a on the upper surface 14e.

As described above, the printed wiring board mounting pads 36a are arranged zigzag with the pitches p2 each approximately twice the pitch p1 for the semiconductor component mounting pads 23a first because the pads 36a are shifted outward from the pads 23a by a size corresponding to the size w when viewing from a center O1 of the auxiliary substrate for hierarchical mounting 14 and secondly because the number of the printed wiring board mounting pads 36a is reduced. Therefore, the pads 36a are more dispersed than the pads 23a.

Next, a description will be given, with reference to FIGS. 4 and 7, of the part of the upper surface 11a of the printed wiring board 11 on which part the auxiliary substrate for hierarchical mounting 14 is mounted.

On the upper surface 11a of the printed wiring board 11, a pad group 40 of a plurality of pads 40a is formed outside the pad group 21. A pitch for the pads 21a of the pad group 21 is equal to the pitch p1 for the pads 23a and is p1. An arrangement of the pads 40a corresponds to that of the pads 36a on the lower surface 14f of the auxiliary substrate for hierarchical mounting 14. That is, the pads 40a are arranged zigzag with the pitches p2. Therefore, a relatively wide gap space 41 is produced between each adjacent ones of the pads 40a. Further, a wiring pattern 42 extends outward from each of the pads 40a.

A wiring pattern 43 extends outward from each of the pads 21a of the pad group 21. The wiring patterns 43 are formed to pass through the relatively wide gap spaces 41 between the adjacent ones of the pads 40a without difficulty. Therefore, the wiring patterns 42 and 43 are arranged without too much density on the upper surface 11a of the printed wiring board 11.

The auxiliary substrate for hierarchical mounting 14 is mounted on the upper surface 11a of the printed wiring board 11 with the pads 36a on the lower surface 14f being soldered to the corresponding pads 40a on the upper surface 11a of the printed wiring board 11. The semiconductor component 16 is mounted on the upper surface 14e of the auxiliary substrate for hierarchical mounting 14 with the lead terminals 22a being soldered to the corresponding pads 23a on the upper surface 14e of the auxiliary substrate for hierarchical mounting 14. In FIG. 5, a signal output from a signal lead terminal 22a travels through first the wiring pattern 35 as indicated by arrow A, then, the through hole 34Aa as indicated by arrow B, and thereafter, the pad 36a, the pad 40a, and the wiring pattern 42 as indicated by arrow C.

[Second Embodiment]

Figure 13:
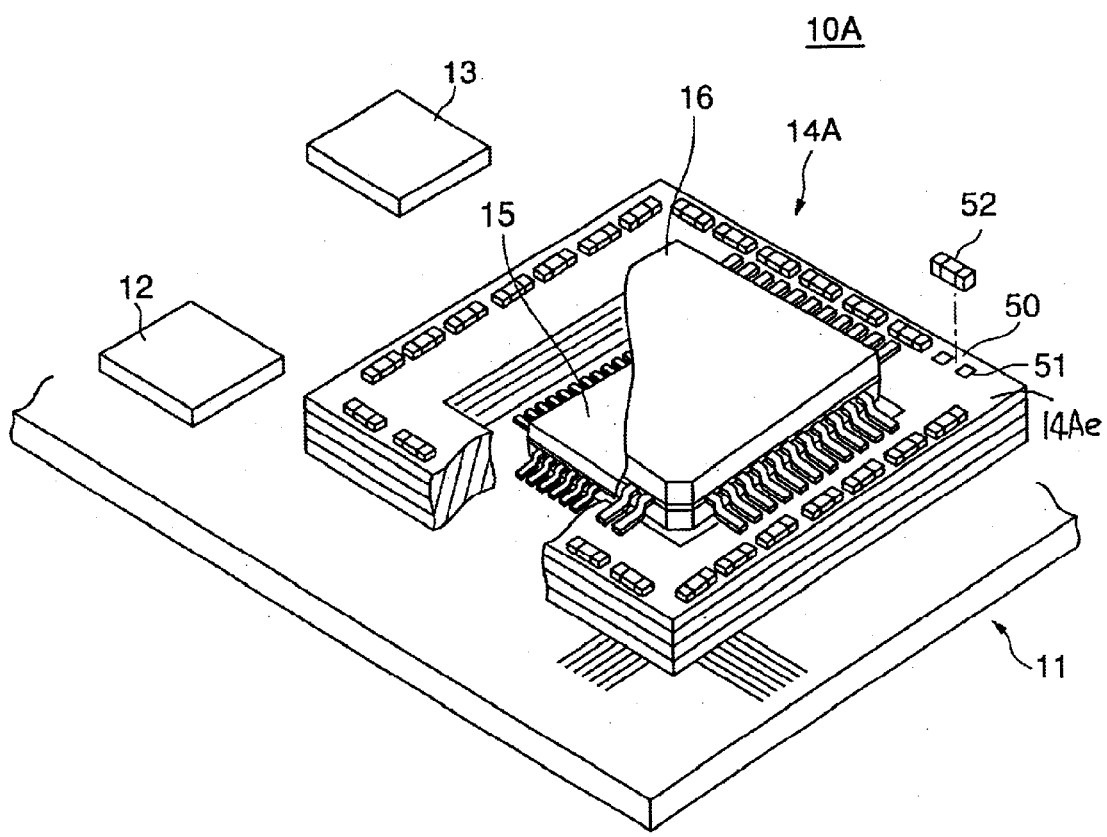
FIG. 13 is a perspective view of a printed wiring board unit according to a second embodiment of the present invention with a part of the printed wiring board unit being cut off.

FIG. 13 is a diagram showing a printed wiring board unit 10A according to a second embodiment of the present invention. The printed wiring board unit 10A has the same structure as the printed wiring board unit 10 shown in FIGS. 1 through 4 except the auxiliary substrate for hierarchical mounting 14A. The auxiliary substrate for hierarchical mounting 14A has chip component mounting parts 50 formed on an upper surface 14Ae thereof. Other than this, the auxiliary substrate for hierarchical mounting 14A has the same structure as the auxiliary substrate for hierarchical mounting 14 shown in FIGS. 8 and 9. Each of the chip component mounting parts 50 is formed of a pair of pads 51. The chip component mounting parts 50 are arranged along a periphery of the auxiliary substrate for hierarchical mounting 14A on the upper surface 14Ae thereof.

A chip component 52 is mounted on each of the chip component mounting parts 50. The chip components 52 are arranged along the periphery of the auxiliary substrate for hierarchical mounting 14A on the upper surface 14Ae thereof.

[Third Embodiment]

Figure 14:
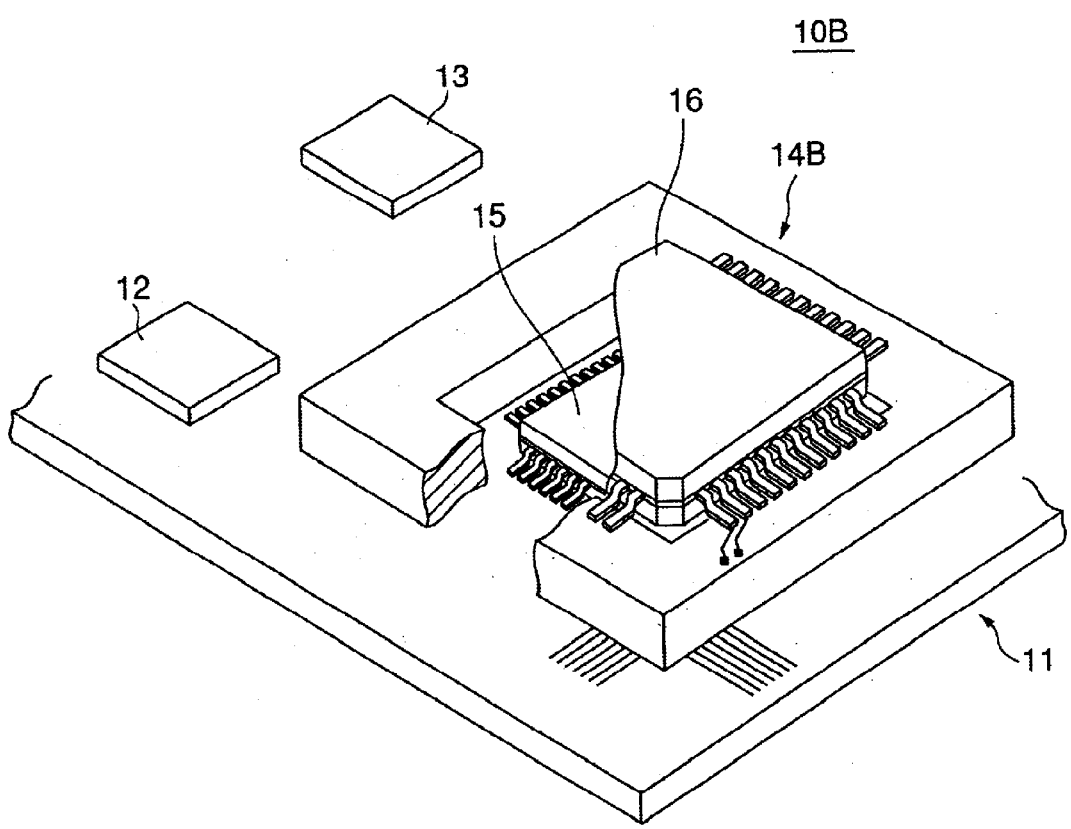
FIG. 14 is a perspective view of a printed wiring board unit according to a third embodiment of the present invention with a part of the printed wiring board unit being cut off.
Figure 15:
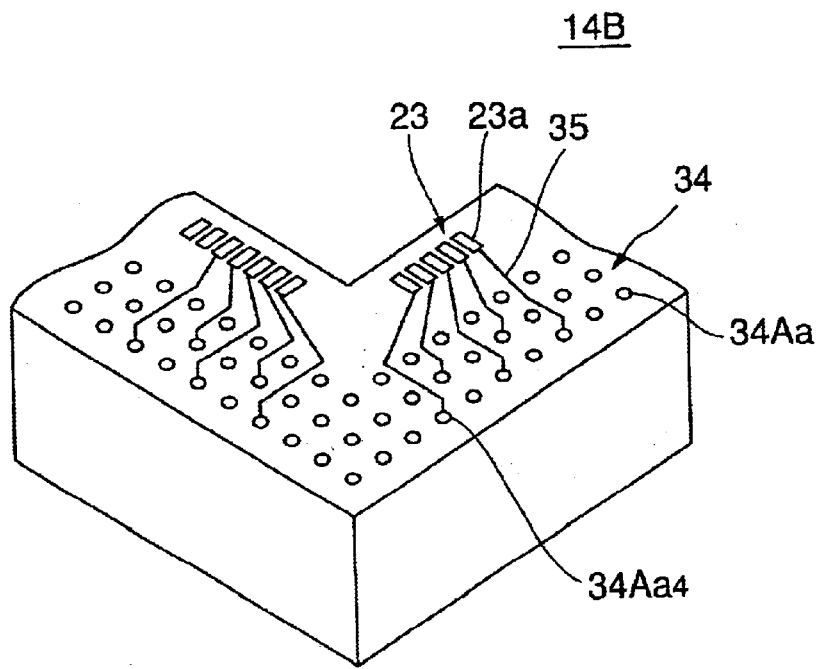
FIG. 15 is an upper-side enlarged fragmentary perspective view of an auxiliary substrate for hierarchical mounting shown in FIG. 14.
Figure 16:
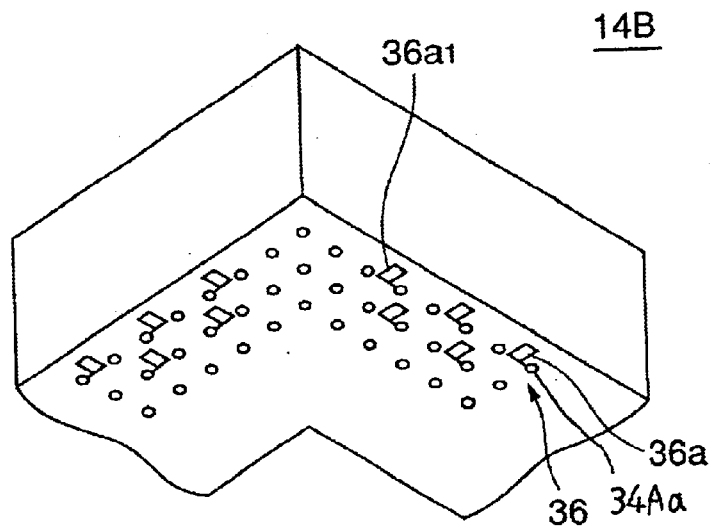
FIG. 16 is a lower-side enlarged fragmentary perspective view of the auxiliary substrate for hierarchical mounting shown in FIG. 14.
Figure 17:
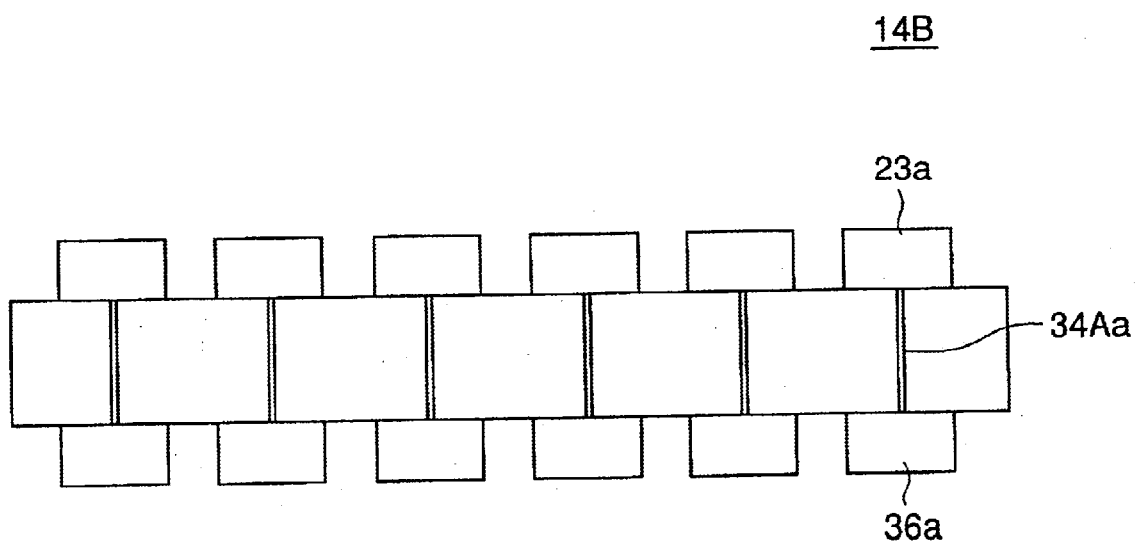
FIG. 17 is a schematic diagram showing an internal structure of one side of the auxiliary substrate for hierarchical mounting shown in FIG. 14.

FIG. 14 is a diagram showing a printed wiring board unit 10B according to a third embodiment of the present invention. The printed wiring board unit 10B has the same structure as the printed wiring board unit 10 shown in FIGS. 1 through 4 except the auxiliary substrate for hierarchical mounting 14B. As shown in FIGS. 15, 16, and 17, the auxiliary substrate for hierarchical mounting 14B includes none of the signal layer 31, the power supply layer 32, and the ground layer 33 shown in FIG. 8. Other than this, the auxiliary substrate for hierarchical mounting 14B has the same structure as the auxiliary substrate for hierarchical mounting 14 shown in FIGS. 3 and 4. The auxiliary substrate for hierarchical mounting 14B includes the printed wiring board pad 36a for each of the semiconductor component mounting pads 23a so that the pads 23a are electrically connected to the corresponding pads 36a through the wiring patterns 35 and the through holes 34Aa.

[Fourth Embodiment]

Figure 18:
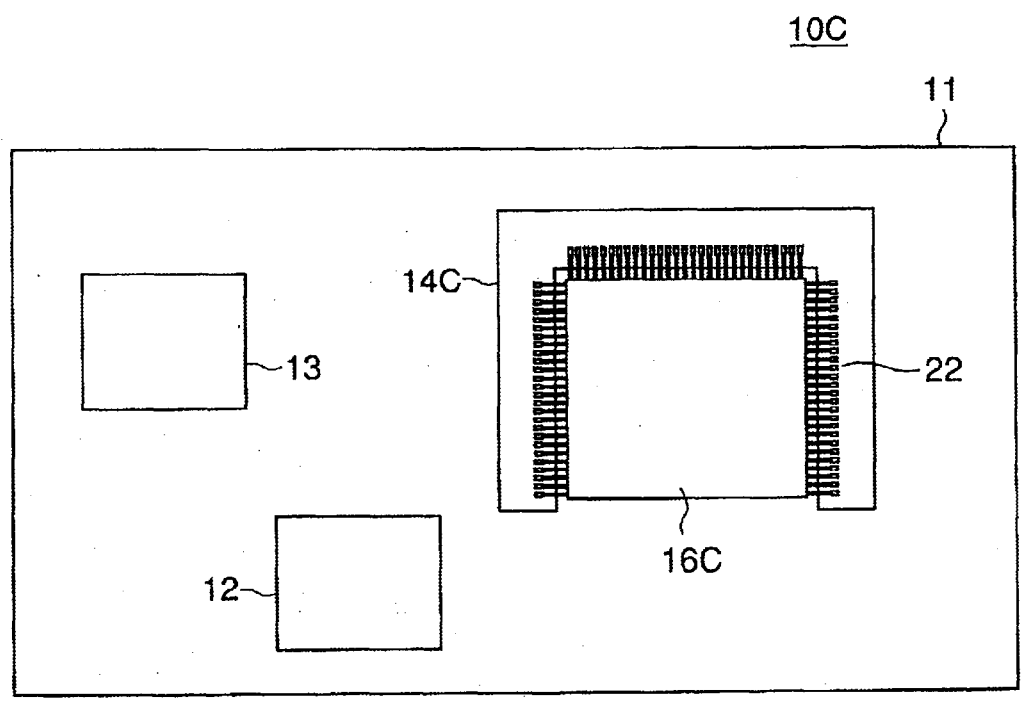
FIG. 18 is a plan view of a printed wiring board unit according to a third embodiment of the present invention.
Figure 19:
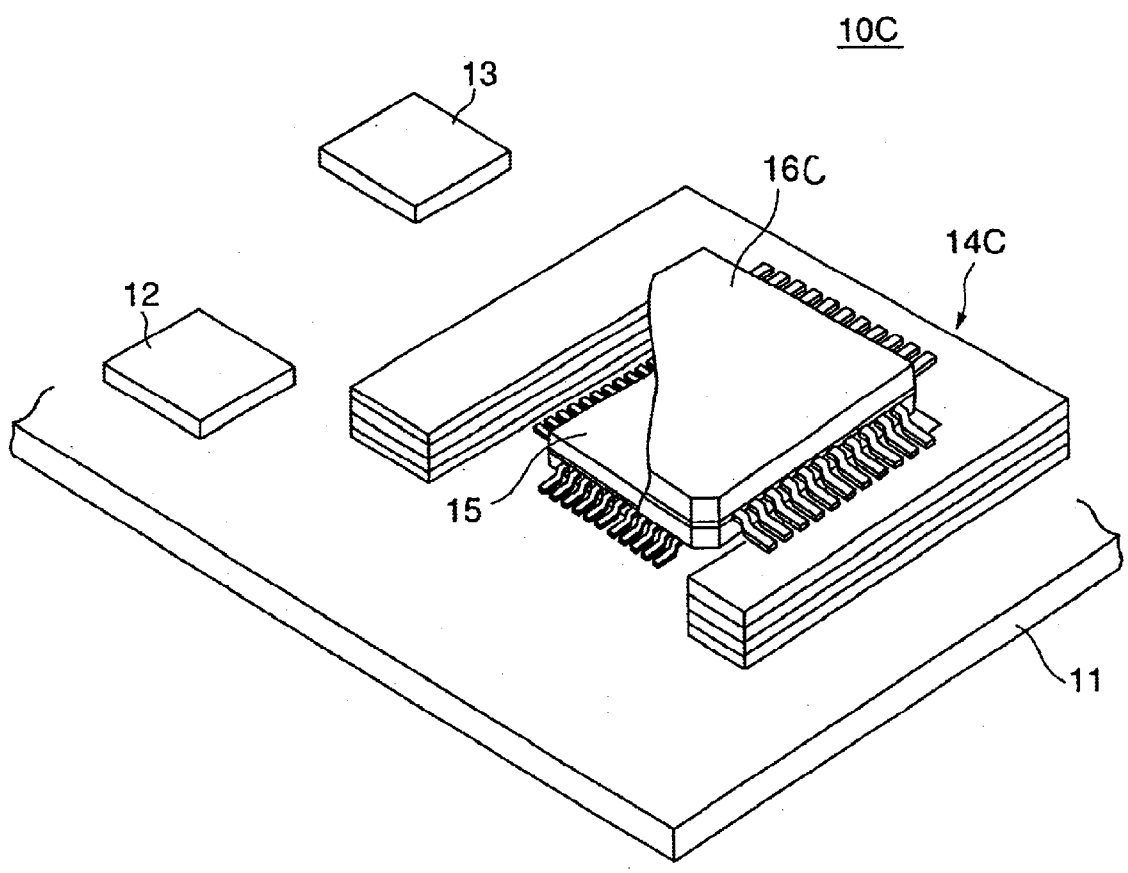
FIG. 19 is a perspective view of the printed wiring board unit of FIG. 18 with a part thereof being cut off.

FIGS. 18 and 19 are diagrams showing a printed wiring board unit 10C according to a fourth embodiment of the present invention. The printed wiring board unit 10C is suitable for a semiconductor component 16C. The semiconductor component 16C has the lead terminal group 22 provided along three of the four sides of a package that is a main body of the semiconductor component 16C. An auxiliary substrate for hierarchical mounting 14C has a U-shape defined by three sides so as to be suitable for the semiconductor component 16C.

Figure 1:
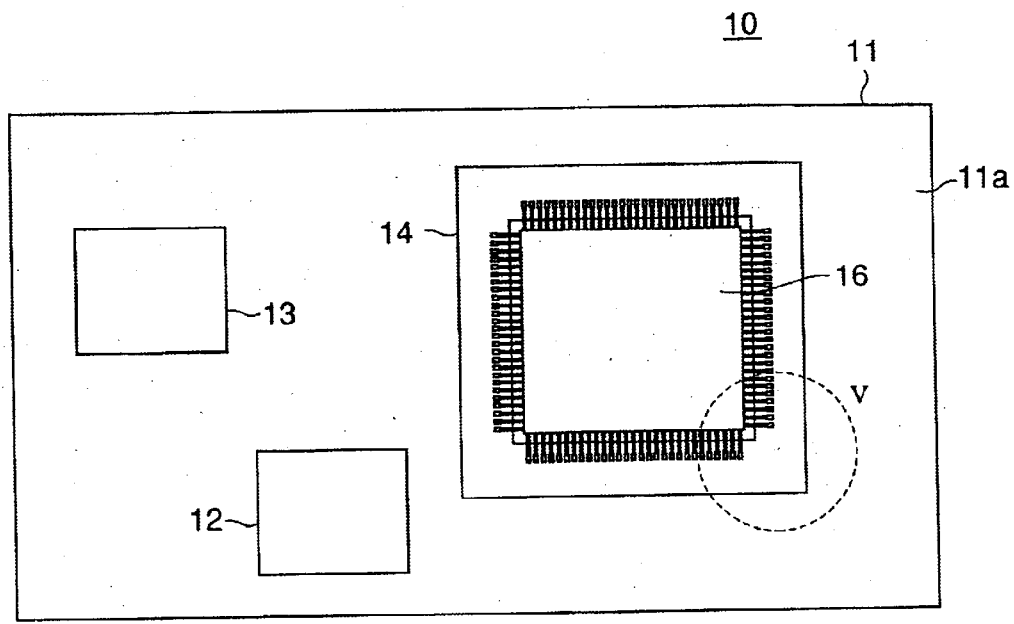
FIG. 1 is a plan view of a printed wiring board unit according to a first embodiment of the present invention.
Figure 2:
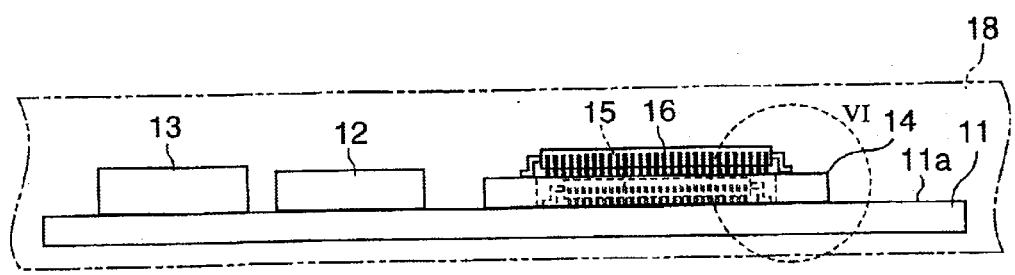
FIG. 2 is a front view of the printed wiring board unit according to the first embodiment of the present invention.

The U-shaped auxiliary substrate for hierarchical mounting 14C is smaller in size than the frame-like auxiliary substrate for hierarchical mounting 14 of FIG. 1 for lacking one side. Therefore, the printed wiring board unit 10C is smaller in size than the printed wiring board unit 10 of FIG. 1.

[Fifth Embodiment]

Figure 20:
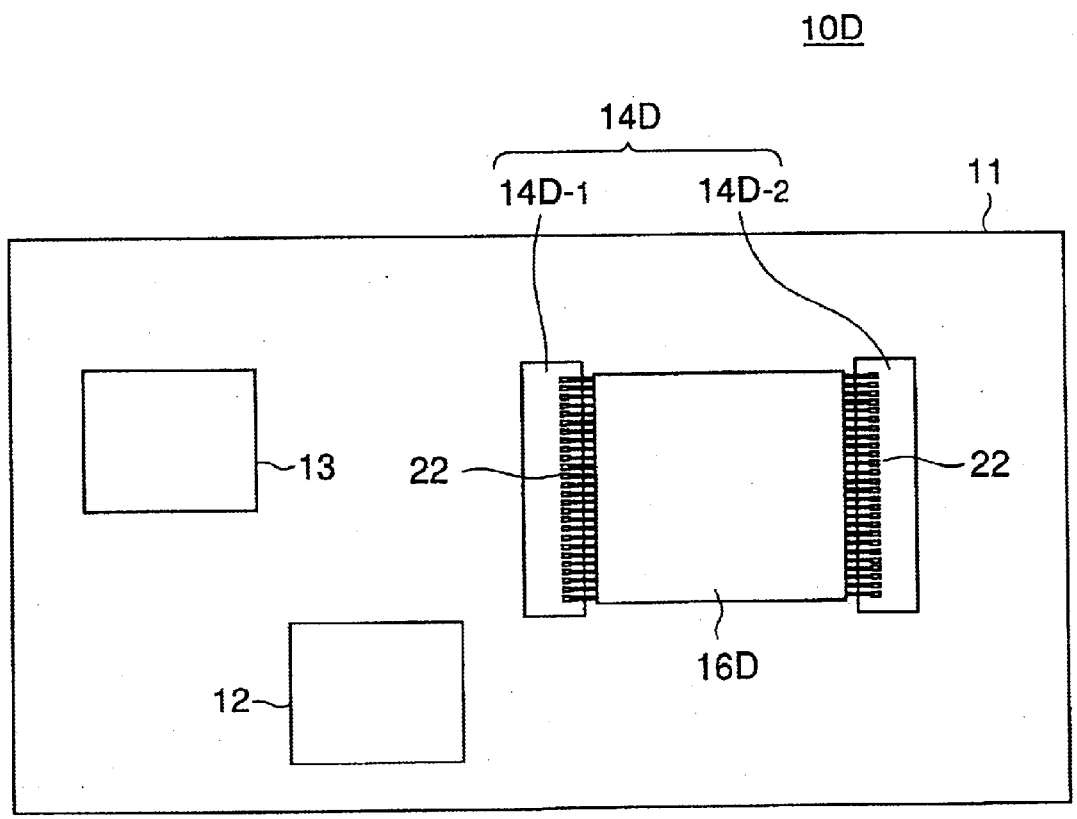
FIG. 20 is a plan view of a printed wiring board unit according to a fourth embodiment of the present invention.
Figure 21:
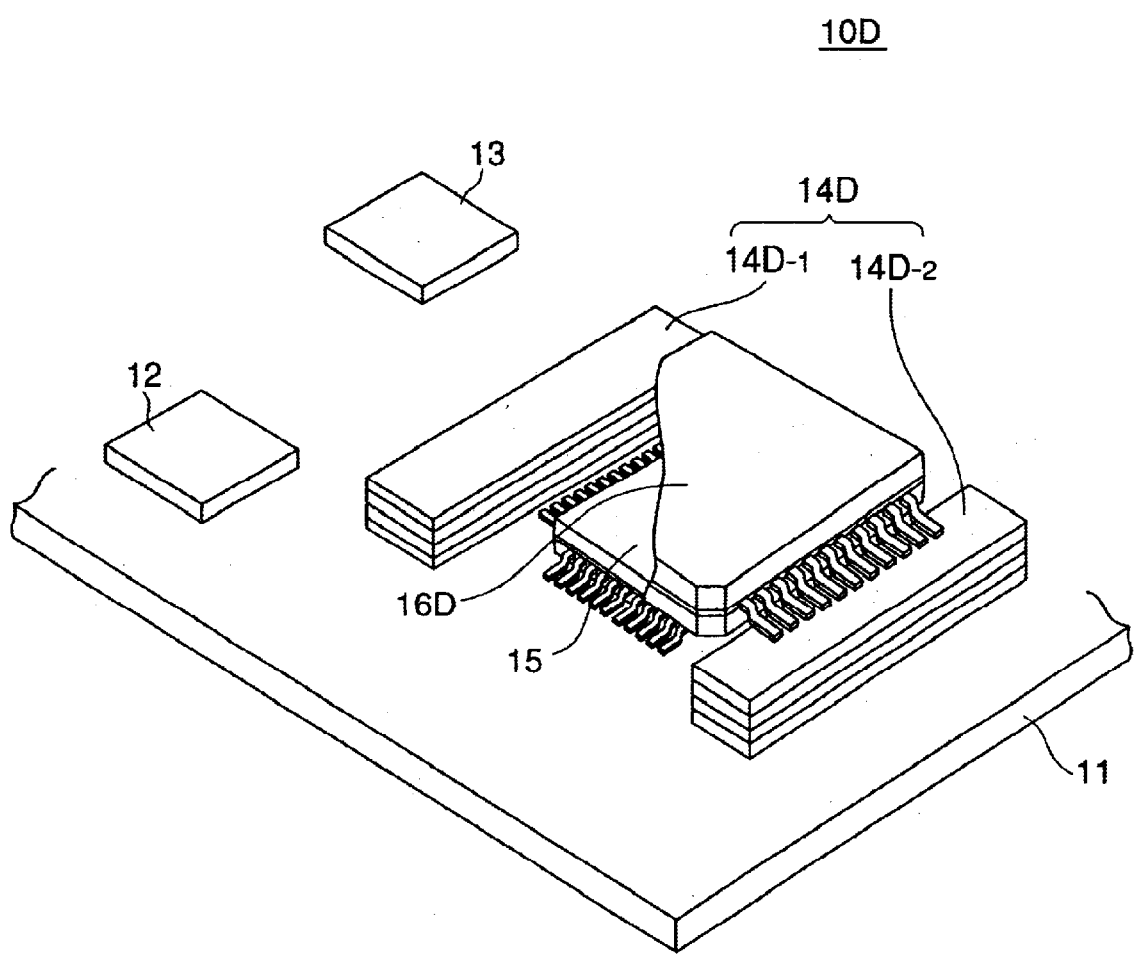
FIG. 21 is a perspective view of the printed wiring board unit of FIG. 20 with a part thereof being cut off.

FIGS. 20 and 21 are diagrams showing a printed wiring board unit 10D according to a fifth embodiment of the present invention. The printed wiring board unit 10D is suitable for a semiconductor component 16D. The semiconductor component 16D has the lead terminal group 22 provided along two opposed sides of a package that is a main body of the semiconductor component 16D. An auxiliary substrate for hierarchical mounting 14D is of a separate type and formed of two independent stick-like auxiliary substrates for hierarchical mounting 14D-1 and 14D-2 so as to be suitable for the semiconductor component 16D. The auxiliary substrate for hierarchical mounting 14D is smaller in size than the frame-like auxiliary substrate for hierarchical mounting 14 of FIG. 1 for lacking two sides. Therefore, the printed wiring board unit 10D is smaller in size than the printed wiring board unit 10 of FIG. 1.

Further, the auxiliary substrate for hierarchical mounting 14D, which is formed of the stick-like auxiliary substrates for hierarchical mounting 14D-1 and 14D-2, can dispense with a process of stamping out a center hole by means of a press, which process is required in producing the auxiliary substrate for hierarchical mounting 14 of FIG. 3. Therefore, it is easier to produce the auxiliary substrate for hierarchical mounting 14D than the auxiliary substrate for hierarchical mounting 14 of FIG. 3.

[Sixth Embodiment]

Figure 22:
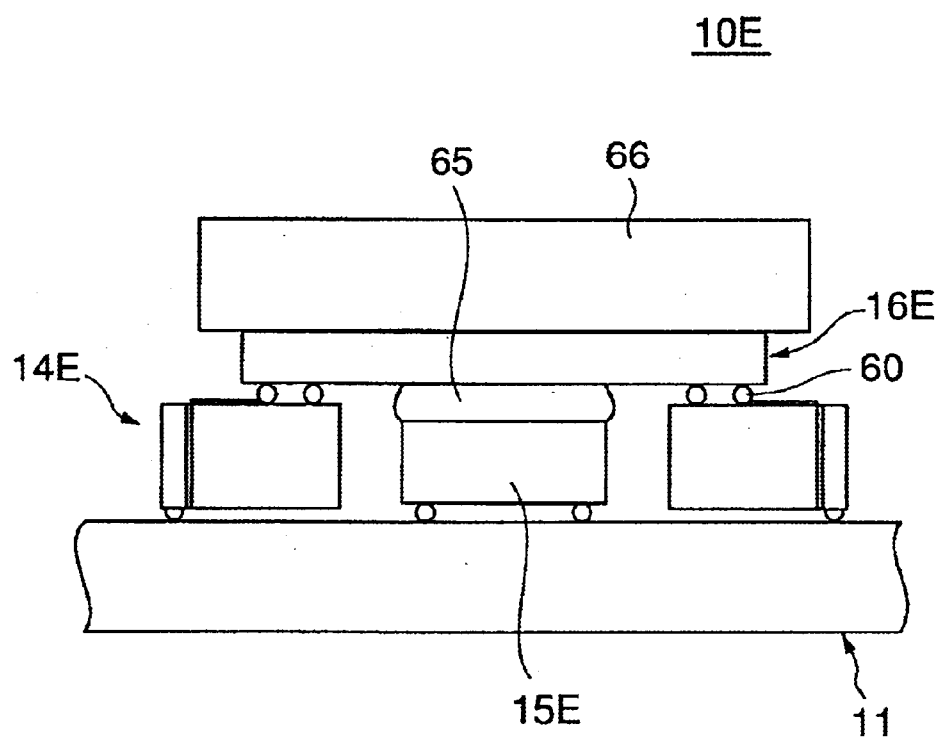
FIG. 22 is a sectional view of a printed wiring board unit according to a fifth embodiment of the present invention.

FIG. 22 is a diagram showing a printed wiring board unit 10E according to a sixth embodiment of the present invention. This embodiment is applied to a semiconductor component that includes bump structure terminals. A semiconductor component 16E includes bumps 60 as terminals on the peripheral part of the lower surface of a package. An auxiliary substrate for hierarchical mounting 14E has a structure suitable for the semiconductor component 16E. A semiconductor component 15E is mounted inside the auxiliary substrate for hierarchical mounting 14E on the printed wiring board 11. The semiconductor component 16E is mounted on the upper surface of the auxiliary substrate for hierarchical mounting 14E, being connected to the bumps 60. The semiconductor component 16E is positioned above the semiconductor component 15E.

Thermal grease 65 is applied between the semiconductor components 15E and 16E and a heat sink 66 is provided on the upper surface of the semiconductor component 16E so that heat generated in the semiconductor components 15E and 16E is dissipated efficiently.

[Seventh Embodiment]

Figure 23:
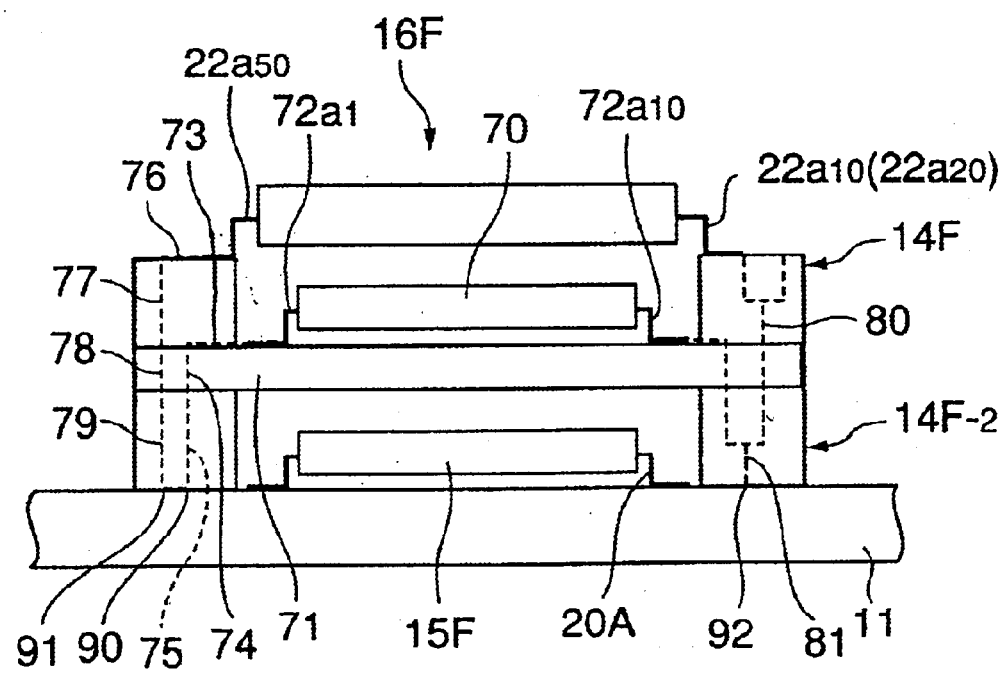
FIG. 23 is a sectional view of a printed wiring board unit according to a sixth embodiment of the present invention.

FIG. 23 is a diagram showing a printed wiring board unit 10F according to a seventh embodiment of the present invention. The printed wiring board unit 10F includes first and second frame-like auxiliary substrates for hierarchical mounting 14F-1 and 14F-2, and has a hierarchical structure where semiconductor components 15F, 70, and 16F are superposed in three tiers.

The semiconductor component 15F is mounted on the printed wiring board 11. The second auxiliary substrate for hierarchical mounting 14F-2 is mounted on the printed wiring board 11 so as to surround the semiconductor component 15F. A small-size auxiliary printed wiring board 71 has its peripheral part mounted on the upper surface of the second auxiliary substrate for hierarchical mounting 14F-2. The semiconductor component 70 is mounted in the center of the upper surface of the auxiliary printed wiring board 71. The first auxiliary substrate for hierarchical mounting 14F-1 is mounted on the auxiliary printed wiring board 71 so as to surround the semiconductor component 70. The semiconductor component 16F is mounted on the upper surface of the first auxiliary substrate for hierarchical mounting 14F-1 with the lead terminals of the semiconductor component 16F being soldered to pads formed on the upper surface of the first auxiliary substrate for hierarchical mounting 14F-1. The semiconductor component 16F is positioned above the semiconductor component 70.

A signal lead terminal 72a1 of the semiconductor component 70 is electrically connected to a pad 90 formed on the printed wiring board 11 via a wiring pattern formed on the auxiliary printed wiring board 71, a through hole 74 of the auxiliary printed wiring board 71, and a through hole 75 of the second auxiliary substrate for hierarchical mounting 14F-2. A lead terminal 22a50 of the semiconductor component 16F is electrically connected to a pad 91 formed on the printed wiring board 11 via a wiring pattern 76 formed on the first auxiliary substrate for hierarchical mounting 14F-1, a through hole 77 of the first auxiliary substrate for hierarchical mounting 14F-1, a through hole 78 of the auxiliary printed wiring board 71, and a through hole 79 of the second auxiliary substrate for hierarchical mounting 14F-2.

The two ground lead terminals 22a10 and 22a20 of the semiconductor component 16F are connected to one through hole 80 in the first auxiliary substrate for hierarchical mounting 14F-1. The one through hole 80 and a ground lead terminal 72a10 of the semiconductor component 70 are connected to one through hole 81 in the second auxiliary substrate for hierarchical mounting 14F-2. The through hole 81 is connected to a ground pad 92 formed on the printed wiring board 11

A pitch for the pads 90, 91, and 92 is long enough to pass a wiring pattern through a space formed between each adjacent ones of the pads 90, 91, and 92. Wiring patterns extending outward from pads to which the lead terminals 20a of the semiconductor component 15F are connected pass through corresponding adjacent ones of the pads 90, 91, and 92 without difficulty.

Any of the printed wiring board units 10A through 10F of the second through sixth embodiments is mounted inside the notebook personal computer 18 as shown in FIG. 12.

What is claimed is:

1. A printed wiring board unit, wherein:

a first component is mounted on a printed wiring board;

an auxiliary substrate for hierarchical mounting is mounted next to the mounted first component on the printed wiring board;

a second component larger in size than the first component is mounted above the first component, the second component being supported on the auxiliary substrate for hierarchical mounting with terminals of the second component being connected thereto; and the auxiliary substrate for hierarchical mounting has component pads on an upper surface thereof and printed wiring board pads on a lower surface thereof, the component pads being connected to the terminals of the second component, the printed wiring board pads being connected to pads on the printed wiring board, the component pads and the printed wiring board pads being electrically connected, the printed wiring board pads being fewer in number than the component pads so that the printed wiring board pads are arranged with a larger pitch than the component pads.

2. The printed wiring board unit as claimed in claim 1, wherein a chip component is mounted on the upper surface of the auxiliary substrate for hierarchical mounting.

3. An electronic apparatus having the printed wiring board unit claimed in claim 1 loaded inside thereof.

4. A printed wiring board unit, wherein:

a first component is mounted on a printed wiring board;

an auxiliary substrate for hierarchical mounting is mounted next to the mounted first component on the printed wiring board;

a second component larger in size than the first component is mounted above the first component, the second component being supported on the auxiliary substrate for hierarchical mounting with terminals of the second component being connected thereto;

the second component has a plurality of ground terminals; and the auxiliary substrate for hierarchical mounting has a ground layer inside thereof, component pads an an upper surface thereof, and printed wiring board pads on a lower surface thereof, the component pads being connected to the terminals of the second component, the printed wiring board pads being connected to pads on the printed wiring board, the component pads and the printed wiring board pads being electrically connected, the component pads including component ground pads connected to the ground terminals of the second component and to the ground layer connected to a ground pad for the printed wiring board, the printed wiring board pads being fewer in number than the component pads so that the printed wiring board pads are arranged with a larger pitch than the component pads.

5. A printed wiring board unit, wherein:

a first component is mounted on a printed wiring board;

an auxiliary substrate for hierarchical mounting is mounted next to the mounted first component on the printed wiring board;

a second component larger in size than the first component is mounted above the first component, the second component being supported on the auxiliary substrate for hierarchical mounting with terminals of the second component being connected thereto;

the second component has a plurality of power supply terminals of equal potentials; and the auxiliary substrate for hierarchical mounting has a power supply layer inside thereof, component pads on an upper surface thereof, and printed wiring board pads on a lower surface thereof, the component pads being connected to the terminals of the second component, the printed wiring board pads being connected to pads on the printed wiring board, the component pads and the printed wiring board pads being electrically connected, the component pads including component power supply pads connected to the power supply terminals of the second component and to the power supply layer connected to a power supply pad for the printed wiring board, the printed wiring board pads being fewer in number than the component pads so that the printed wiring board pads are arranged with a larger pitch than the component pads.

6. A printed wiring board unit, wherein:

a first component is mounted on a printed wiring board;

an auxiliary substrate for hierarchical mounting is mounted next to the mounted first component on the printed wiring board;

a second component larger in size than the first component is mounted above the first component, the second component being supported on the auxiliary substrate for hierarchical mounting with terminals of the second component being connected thereto;

the second component has a plurality of ground terminals and a plurality of power supply terminals of equal potentials; and the auxiliary substrate for hierarchical mounting has a ground layer and a power supply layer inside thereof, component pads on an upper surface thereof, and printed wiring board pads on a lower surface thereof, the component pads being connected to the terminals of the second component, the printed wiring board pads being connected to pads on the printed wiring board, the component pads and the printed wiring board pads being electrically connected, the component pads including component ground pads connected to the ground terminals of the second component and to the ground layer connected to a ground pad for the printed wiring board, the component pads including component power supply pads connected to the power supply terminals of the second component and to the power supply layer connected to a power supply pad for the printed wiring board, the printed wiring board pads being fewer in number than the component pads so that the printed wiring board pads are arranged with a larger pitch than the component pads.

7. An auxiliary substrate for hierarchical mounting mounted next to a first component mounted on a printed board, the auxiliary substrate for hierarchical mounting comprising:

component pads on an upper surface thereof and printed wiring board pads on a lower surface thereof, the component pads being connected to terminals of a second component larger in size than the first component, the printed wiring board pads being connected to pads on the printed wiring board, the component pads and the printed wiring board pads being electrically connected, the printed wiring board pads being fewer in number than the component pads so that the printed wiring board pads are arranged with a larger pitch than the component pads.

8. The auxiliary substrate for hierarchical mounting as claimed in claim 7, characterized by having a frame-like shape, a U-shape, or a shape of two separated sticks.

9. An auxiliary substrate for hierarchical mounting mounted next to a first component mounted on a printed board, the auxiliary substrate for hierarchical mounting comprising:

a ground layer inside thereof, component pads on an upper surface thereof, and printed wiring board pads on a lower surface thereof, the component pads being connected to terminals of a second component larger in size than the first component, the printed wiring board pads being connected to pads on the printed wiring board, the component pads and the printed wiring board pads being electrically connected, the component pads including component ground pads connected to a plurality of ground terminals of the component and to the ground layer connected to a ground pad for the printed wiring board, the printed wiring board pads being fewer in number than the component pads so that the printed wiring board pads are arranged with a larger pitch than the component pads.

10. An auxiliary substrate for hierarchical mounting mounted next to a first component mounted on a printed board, the auxiliary substrate for hierarchical mounting comprising:

a power supply layer inside thereof, component pads on an upper surface thereof, and printed wiring board pads on a lower surface thereof, the component pads being connected to terminals of a second component larger in size than the first component, the printed wiring board pads being connected to pads on the printed wiring board, the component pads and the printed wiring board pads being electrically connected, the component pads including component power supply pads connected to a plurality of power supply terminals of the component and to the power supply layer connected to a power supply pad for the printed wiring board, the power supply terminals being of equal potentials, the printed wiring board pads being fewer in number than the component pads so that the printed wiring board pads are arranged with a larger pitch than the component pads.

11. An auxiliary substrate for hierarchical mounting mounted next to a first component mounted on a printed board, the auxiliary substrate for hierarchical mounting comprising:

a ground layer and a power supply layer inside thereof, component pads on an upper surface thereof, and printed wiring board pads on a lower surface thereof, the component pads being connected to terminals of a second component larger in size than the first component, the printed wiring board pads being connected to pads on the printed wiring board, the component pads and the printed wiring board pads being electrically connected, the component pads including component ground pads connected to a plurality of ground terminals of the component and to the ground layer connected to a ground pad for the printed wiring board, the component pads including component power supply pads connected to a plurality of power supply terminals of the component and to the power supply layer connected to a power supply pad for the printed wiring board, the power supply terminals being of equal potentials, the printed wiring board pads being fewer in number than the component pads so that the printed wiring board pads are arranged with a larger pitch than the component pads.

* * * * *